US010991823B2

(12) United States Patent
Balakrishnan et al.

(10) Patent No.: US 10,991,823 B2
(45) Date of Patent: *Apr. 27, 2021

(54) FABRICATION OF VERTICAL FIN TRANSISTOR WITH MULTIPLE THRESHOLD VOLTAGES

(71) Applicant: INTERNATIONAL BUSINESS MACHINES CORPORATION, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/783,781

(22) Filed: Oct. 13, 2017

(65) Prior Publication Data

US 2018/0053848 A1  Feb. 22, 2018

Related U.S. Application Data

(62) Division of application No. 15/086,542, filed on Mar. 31, 2016.

(51) Int. Cl.
*H01L 21/8234* (2006.01)
*H01L 29/78* (2006.01)
(Continued)

(52) U.S. Cl.
CPC .... *H01L 29/7827* (2013.01); *H01L 21/02236* (2013.01); *H01L 21/02252* (2013.01);
(Continued)

(58) Field of Classification Search
CPC ......... H01L 21/02293; H01L 21/02634; H01L 21/2018; H01L 21/2022–2026;
(Continued)

(56) References Cited

U.S. PATENT DOCUMENTS 6,114,206 A  9/2000 Yu
6,262,456 B1  7/2001 Yu et al.
(Continued)

FOREIGN PATENT DOCUMENTS

CN  103632969  3/2014
CN  103681326  3/2014
CN  104425283  3/2015

OTHER PUBLICATIONS

List of IBM Patents or Patent Applications Treated as Related dated Oct. 13, 2017, 2 pages.
(Continued)

*Primary Examiner* — Mary A Wilczewski
*Assistant Examiner* — Tsz K Chiu
(74) *Attorney, Agent, or Firm* — Tutunjian & Bitetto, P.C.; Randall Bluestone

(57) ABSTRACT

A vertical fin field effect transistor including a doped region in a substrate, wherein the doped region has the same crystal orientation as the substrate, a first portion of a vertical fin on the doped region, wherein the first portion of the vertical fin has the same crystal orientation as the substrate and a first portion width, a second portion of the vertical fin on the first portion of the vertical fin, wherein the second portion of the vertical fin has the same crystal orientation as the first portion of the vertical fin, and the second portion of the vertical fin has a second portion width less than the first portion width, a gate structure on the second portion of the vertical fin, and a source/drain region on the top of the second portion of the vertical fin.

20 Claims, 11 Drawing Sheets

(51) Int. Cl.
*H01L 29/10* (2006.01)
*H01L 29/165* (2006.01)
*H01L 27/088* (2006.01)
*H01L 29/66* (2006.01)
*H01L 21/02* (2006.01)
*H01L 21/762* (2006.01)
*H01L 29/161* (2006.01)
*H01L 27/082* (2006.01)

(52) U.S. Cl.
CPC .. *H01L 21/02381* (2013.01); *H01L 21/02532* (2013.01); *H01L 21/76224* (2013.01); *H01L 21/823412* (2013.01); *H01L 21/823487* (2013.01); *H01L 27/088* (2013.01); *H01L 29/1037* (2013.01); *H01L 29/1054* (2013.01); *H01L 29/165* (2013.01); *H01L 29/66666* (2013.01); *H01L 21/823481* (2013.01); *H01L 27/0825* (2013.01); *H01L 27/0828* (2013.01); *H01L 29/161* (2013.01); *H01L 2251/5346* (2013.01)

(58) Field of Classification Search
CPC ........... H01L 21/3147; H01L 21/02631; H01L 21/2033–2036; H01L 21/2085; H01L 21/2855; H01L 21/76248; H01L 21/76262; H01L 21/76278; H01L 21/76294; H01L 21/76297; H01L 29/165; H01L 29/66795; H01L 29/66818; H01L 29/1054; H01L 2251/5346; H01L 21/02532; H01L 27/1229; H01L 27/1233; H01L 27/1237; H01L 27/1251; C30B 25/02–22

See application file for complete search history.

(56) References Cited

U.S. PATENT DOCUMENTS

| | | | |
|---|---|---|---|
| 6,281,559 B1 | 8/2001 | Yu et al. | |
| 6,861,304 B2 | 3/2005 | Hisamoto et al. | |
| 7,250,658 B2* | 7/2007 | Doris | H01L 21/845 257/328 |
| 7,528,424 B2 | 5/2009 | Ramaswamy et al. | |
| 7,732,874 B2* | 6/2010 | Zhu | H01L 21/823842 257/401 |
| 7,993,999 B2 | 8/2011 | Basker et al. | |
| 8,294,222 B2 | 10/2012 | Anderson et al. | |
| 8,395,195 B2* | 3/2013 | Chang | H01L 29/7853 257/255 |
| 8,697,511 B2 | 4/2014 | Masuoka et al. | |
| 8,946,018 B2* | 2/2015 | Guha | H01L 21/26513 438/234 |
| 8,951,870 B2 | 2/2015 | Basker et al. | |
| 9,006,842 B2 | 4/2015 | Colinge et al. | |
| 9,117,690 B2 | 8/2015 | Masuoka et al. | |
| 9,214,348 B2 | 12/2015 | Son et al. | |
| 9,287,402 B2* | 3/2016 | Oh | H01L 29/66477 |
| 9,373,702 B2* | 6/2016 | Li | H01L 21/823814 |
| 9,385,195 B1 | 7/2016 | Zhang | |
| 9,484,266 B1* | 11/2016 | Balakrishnan | H01L 21/02636 |
| 9,484,347 B1 | 11/2016 | Cheng et al. | |
| 9,559,120 B2* | 1/2017 | Cheng | H01L 21/02236 |
| 9,614,087 B1 | 4/2017 | Cheng et al. | |
| 9,653,362 B2* | 5/2017 | Balakrishnan | H01L 21/823807 |
| 9,653,585 B2 | 5/2017 | Zhang | |
| 9,698,225 B2* | 7/2017 | Leobandung | H01L 29/6656 |
| 9,711,535 B2* | 7/2017 | Wang | H01L 29/66795 |
| 9,780,088 B1 | 10/2017 | Balakrishnan et al. | |
| 9,799,570 B1 | 10/2017 | Cheng | |
| 9,837,405 B1 | 12/2017 | Cheng et al. | |
| 9,853,101 B2* | 12/2017 | Peng | H01L 29/0673 |
| 9,911,660 B2* | 3/2018 | Yoon | H01L 21/0262 |
| 9,947,663 B2* | 4/2018 | Basker | H01L 27/0924 |
| 9,984,937 B1 | 5/2018 | Bi et al. | |
| 10,121,858 B2* | 11/2018 | Oxland | H01L 21/02546 |
| 10,535,570 B1 | 1/2020 | Ando et al. | |
| 2007/0221956 A1* | 9/2007 | Inaba | H01L 21/823807 257/197 |
| 2010/0144121 A1* | 6/2010 | Chang | H01L 29/1054 438/478 |
| 2010/0219483 A1 | 9/2010 | Masuoka et al. | |
| 2011/0147811 A1* | 6/2011 | Kavalieros | H01L 29/66795 257/288 |
| 2011/0233512 A1 | 9/2011 | Yang et al. | |
| 2011/0303985 A1 | 12/2011 | Masuoka et al. | |
| 2013/0093026 A1* | 4/2013 | Wann | H01L 21/823821 257/401 |
| 2013/0224936 A1* | 8/2013 | Lee | H01L 21/82343 438/492 |
| 2013/0270641 A1* | 10/2013 | Chi | H01L 21/823821 257/351 |
| 2014/0170839 A1* | 6/2014 | Brunco | H01L 29/66795 438/479 |
| 2015/0028454 A1* | 1/2015 | Cheng | H01L 29/785 257/616 |
| 2015/0194525 A1 | 7/2015 | Xu et al. | |
| 2016/0315084 A1* | 10/2016 | Wu | H01L 27/0924 |
| 2016/0322501 A1* | 11/2016 | Cheng | H01L 29/7851 |
| 2017/0005090 A1* | 1/2017 | Ando | H01L 27/0886 |
| 2017/0069630 A1* | 3/2017 | Cha | H01L 27/0924 |
| 2017/0179284 A1* | 6/2017 | Kim | H01L 29/7843 |
| 2018/0090494 A1 | 3/2018 | Chao et al. | |
| 2018/0151727 A1 | 5/2018 | Cheng et al. | |

OTHER PUBLICATIONS

Final Office Action with cited art in corresponding U.S. Appl. No. 15/783,749 dated Nov. 30, 2018.
Notice of Allowance with cited art in corresponding U.S. Appl. No. 15/783,693 dated Mar. 12, 2019.
Office Action dated May 17, 2019 for U.S. Appl. No. 15/783,749, 21 pages.
Final Office Action with cited art in corresponding U.S. Appl. No. 15/783,749 dated Dec. 7, 2020.
U.S. Notice of Allowance issued in U.S. Appl. No. 15/783,749 dated Feb. 18, 2021, pp. 1-11.

* cited by examiner

FABRICATION OF VERTICAL FIN TRANSISTOR WITH MULTIPLE THRESHOLD VOLTAGES

BACKGROUND

Technical Field

The present invention relates to vertical fin field effect transistors (finFETs) with graded compound semiconductors, and more particularly to a pair of vertical finFETs having fin channels with different fin widths and semiconductor compositions.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been formed with the source, channel, and drain formed in the substrate material itself, where the current flows horizontally (i.e., in the plane of the substrate), and finFETs have been formed with the channel extending outward from the substrate, but where the current also flows horizontally. The channel for the finFET can be an upright slab of thin rectangular Si, commonly referred to as the fin with a gate on the fin, as compared to a MOSFET with a single planar gate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are connected together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

A vertical fin field effect transistor including a doped region in a substrate, wherein the doped region has the same crystal orientation as the substrate, a first portion of a vertical fin on the doped region, wherein the first portion of the vertical fin has the same crystal orientation as the substrate and a first portion width, a second portion of the vertical fin on the first portion of the vertical fin, wherein the second portion of the vertical fin has the same crystal orientation as the first portion of the vertical fin, and the second portion of the vertical fin has a second portion width less than the first portion width, a gate structure on the second portion of the vertical fin, and a source/drain region on the top of the second portion of the vertical fin.

A pair of vertical fin field effect transistors including a first doped region in a substrate, and a second doped region in the substrate adjacent to the first doped region, wherein the first doped region and second doped region have the same crystal orientation as the substrate, an unmodified vertical fin on the first doped region, wherein the unmodified vertical fin has the same crystal orientation as the substrate and an unmodified width, a modified vertical fin on the second doped region, wherein the modified vertical fin has the same crystal orientation as the substrate and at least a portion of the modified vertical fin has a modified width less than the unmodified width, a gate structure on the modified vertical fin, and a gate structure on the unmodified vertical fin.

A method of fabricating one or more vertical fin field effect transistors including epitaxially growing a first vertical fin of silicon-germanium on a substrate, forming a cap on the top surface of the first vertical fin, oxidizing the sidewalls of the first vertical fin to form silicon oxide layers at least on opposite sides of the first vertical fin, and increasing the germanium concentration of the first vertical fin, and removing the silicon oxide layers to form a portion of the first vertical fin having a reduced width.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
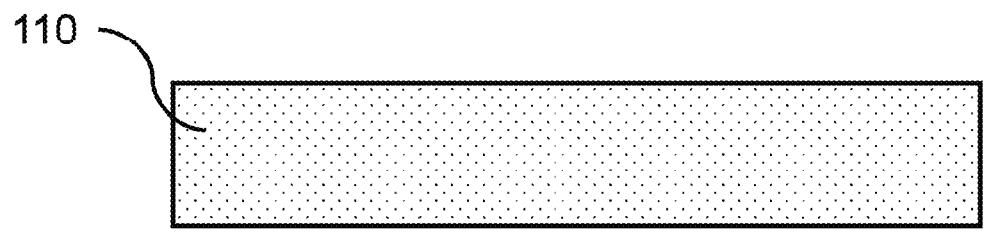
FIG. 1 is a cross-sectional view of a substrate in accordance with an exemplary embodiment.

Principles and embodiments of the present disclosure relate generally to vertical finFETs including vertical fins having modified concentrations of compound semiconductors, and approaches to fabricating vertical fins with modified or graded concentrations of compound semiconductors. Two vertical fins having different widths and different concentrations of semiconductor components may be formed adjacent to each other, where the concentrations of semiconductor components may be modified by selective oxidation. The modified concentrations of semiconductor components may provide multiple threshold voltages, $V_t$, to tune the power and performance characteristics of the finFET device(s).

One or more embodiments relate to a channel last replacement metal gate vertical finFET having multiple threshold voltages. Multiple threshold voltages may be achieved by forming channel regions having different dopant concentrations. A vertical finFET having multiple threshold voltages may be fabricated from silicon-germanium (SiGe) by epitaxially growing one or more SiGe fins from a silicon substrate. An exposed portion of a SiGe fin may be selectively oxidized to increase the concentration of Ge in the SiGe fin.

In various embodiments, two vertical SiGe fins may be epitaxially grown from a silicon substrate, and one of the two vertical SiGe fins selectively oxidized to reduce the width of the vertical fin while increasing the concentration of the germanium component in the SiGe fin.

Principle and embodiments of the present disclosure also relate to a semiconductor device structure with conductive elements stacked on the substrate to form a conductive path normal to the surface of the substrate on which the semiconductor structure is formed. An embodiment relates generally to a vertical finFET structure that provides multiple threshold voltages. In an embodiment, a finFET semiconductor device has the drain, fin channel, and source device components arranged perpendicular to the plane of the substrate surface, which is referred to as a vertical stack. A vertically stacked finFET can have a longer gate length (i.e., height) and larger dielectric spacer than a horizontal (i.e., having the drain, fin channel, and source device components arranged parallel with the plane of the substrate surface) finFET having comparable contact gate pitch.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, which is a cross-sectional view of a substrate in accordance with an exemplary embodiment.

In one or more embodiments, a vertical fin may be formed on a crystalline substrate, where the substrate may have a surface with a lattice constant that facilitates epitaxial growth of a compound semiconductor. In various embodiments, the substrate 110 may be a semiconductor substrate, where the substrate may be a single crystal semiconductor wafer or a crystalline semiconductor layer on a supporting wafer. In various embodiments, the substrate may be silicon or silicon-germanium. The substrate may be a semiconductor-on-insulator (SeOI), silicon-on-insulator (SOI), or silicon-germanium-on-insulator (SGOI). The substrate 110 may have a <100> or a <111> crystal face exposed for subsequent depositions, where the crystal lattice may facilitate epitaxial growth.

Figure 2:
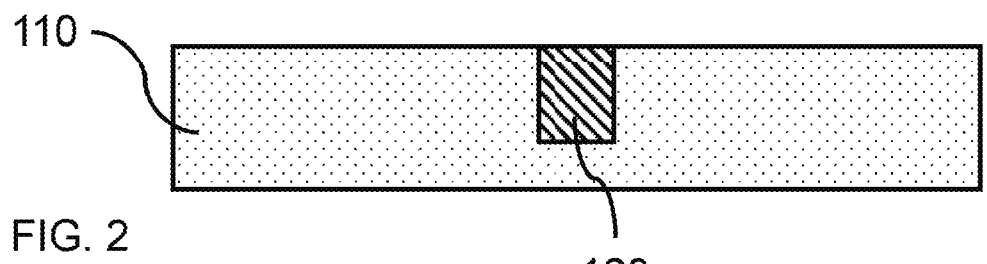
FIG. 2 is a cross-sectional view of a substrate and isolation region in accordance with an exemplary embodiment.

FIG. 2 is a cross-sectional view of a substrate and isolation region in accordance with an exemplary embodiment.

In one or more embodiments, a substrate may be masked and patterned to form one or more trench(es) in which an insulator material may be formed. The trench and insulator material may provide an isolation region 120 for subsequent layers and structures formed on the substrate. In various embodiments, the isolation region 120 provides shallow trench isolation for adjacent device structures, where the device structures may be vertical finFETs. In one or more embodiments, the isolation region 120 includes an oxide, for example, silicon oxide ($SiO_x$).

Figure 3:
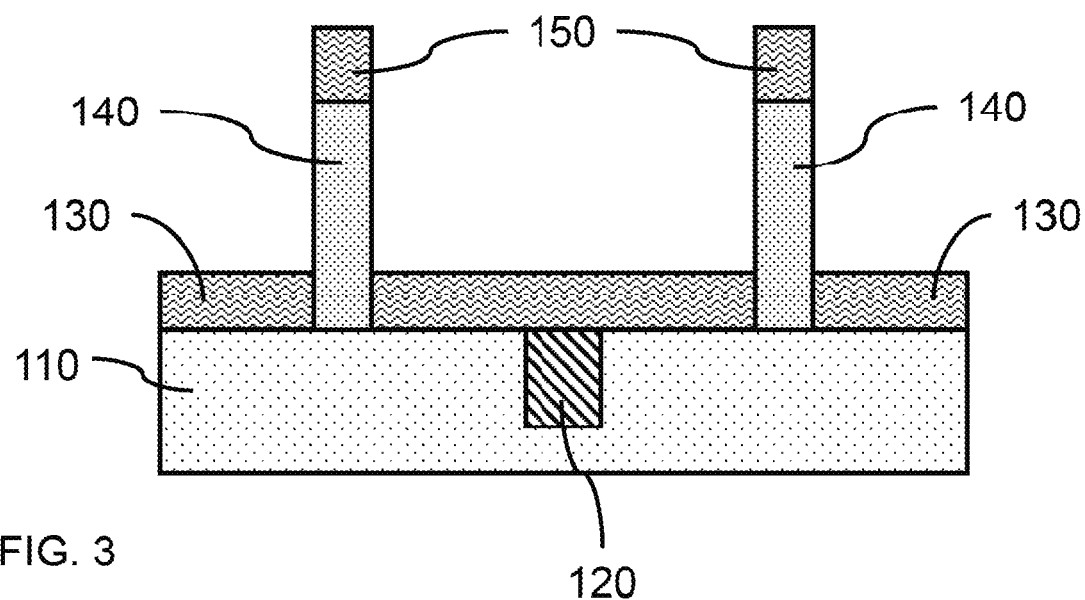
FIG. 3 is a cross-sectional view of a substrate with vertical fins in accordance with an exemplary embodiment.

FIG. 3 is a cross-sectional view of a substrate with vertical fins in accordance with an exemplary embodiment.

In one or more embodiments, a hardmask may be formed on the substrate 110, patterned, and etched to expose a portion of the substrate 110. A vertical fin 140 may be formed on at least the exposed portions of the substrate 110, where the vertical fin 140 may be formed by any known patterning techniques, for example, sidewall image transfer, lithography and etching, and epitaxy. In various embodiments, the vertical fin 140 may be epitaxially grown from the crystalline surface of the substrate.

In various embodiments, the vertical fin 140 may be a compound semiconductor, for example, silicon-germanium (SiGe). In various embodiments, the crystal lattice of the exposed substrate surface may be selected to control the amount of stress induced in the epitaxially grown compound semiconductor material. In various embodiments, the substrate 110 may be silicon, and the vertical fin 140 may be SiGe. The SiGe fin may be formed by first epitaxially growing a SiGe layer on the surface of the Si substrate. A suitable patterning technique may then be applied to pattern the epitaxially grown SiGe layer into one or more vertical fin(s) 140. In some embodiments, the substrate surface may be masked and patterned to provide exposed portions of the substrate on which vertical fin(s) 140 may be epitaxially grown. The mask may then be removed to expose the substrate surface between the vertical fin(s) 140.

In one or more embodiments, the exposed portion of the substrate in the mask pattern may have a width in the range of about 5 nm to about 25 nm, or in the range of about 10 nm to about 20 nm, or in the range of about 10 nm to about 15 nm. In various embodiments, the vertical fin 140 may have a width in the range of about 5 nm to about 25 nm, or in the range of about 10 nm to about 20 nm, or in the range of about 10 nm to about 15 nm.

In various embodiments, a bottom spacer 130 may be formed on the portions of the substrate 110, where the bottom spacer 130 may be between at least a doped region (e.g., source/drain) and a subsequently formed gate structure. The bottom spacer 130 may provide electrical insulation between the substrate 110 and/or doped region (e.g., source/drain) and a gate structure formed on the vertical fin 140. The height (i.e., thickness) of the bottom spacer 130 may be less than the height of the fin 140. In various embodiments, the bottom spacer 130 may be a nitride, for example, silicon nitride (SiN). The vertical fin(s) 140 may have a cap 150 formed on the top surface to protect the fin 140 during various processing steps of device manufacturing.

Figure 4:
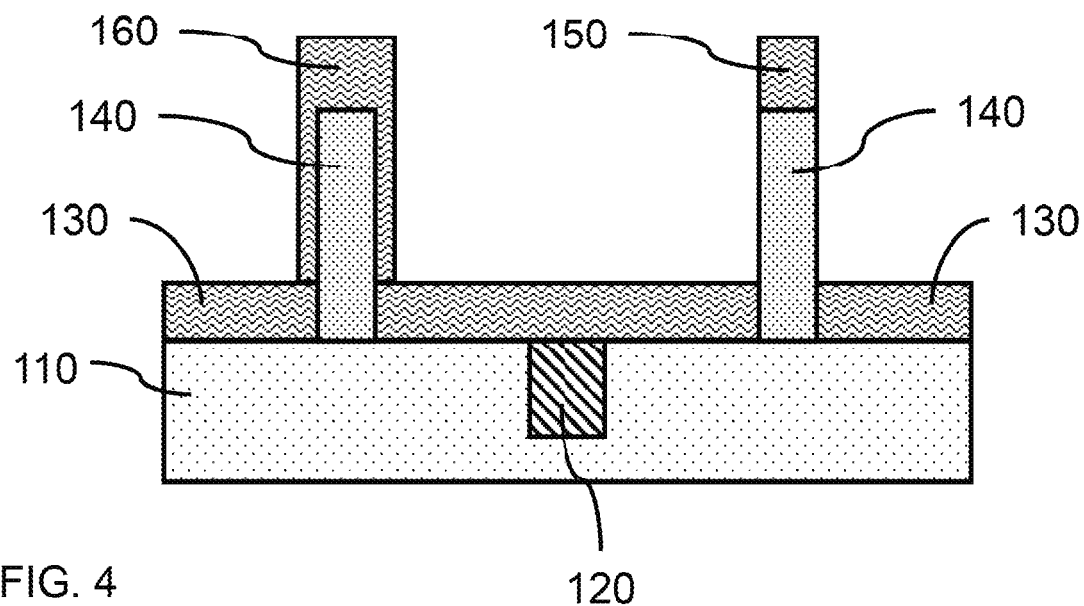
FIG. 4 is a cross-sectional view of a substrate with a capped vertical fin in accordance with an exemplary embodiment.

FIG. 4 is a cross-sectional view of a substrate with a capped vertical fin in accordance with an exemplary embodiment.

In one or more embodiments, a protective cap 160 may be formed over one or more vertical fin(s), where the protective cap 160 may be formed conformally over the sidewalls of the vertical fin 140. In various embodiments, the protective cap 160 may be deposited by atomic layer deposition (ALD) or chemical vapor deposition (CVD), a variation thereof (e.g., plasma enhanced, low pressure, metal-organic, etc.), and/or a combination thereof. One or more vertical fin(s) 140 may not be covered by a protective cap 160, such that the sidewalls of the unprotected vertical fin(s) 140 remain exposed.

In various embodiments, the protective cap 160 may be a nitride, for example, silicon nitride (SiN).

Figure 5:
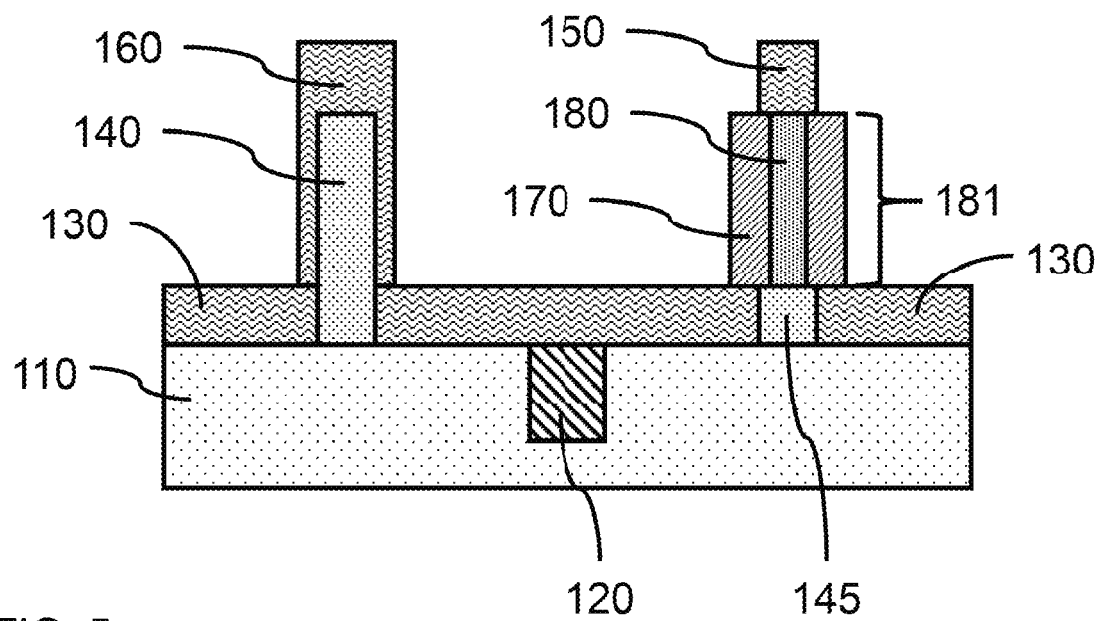
FIG. 5 is a cross-sectional view of a capped vertical fin and an oxidized vertical fin in accordance with an exemplary embodiment.

FIG. 5 is a cross-sectional view of a capped vertical fin and an oxidized vertical fin in accordance with an exemplary embodiment.

In one or more embodiments, the bottom spacer 130, protective cap 160, and exposed vertical fin 140 may be exposed to an oxidizing environment, for example, dry thermal oxidation in an oxygen atmosphere or use of an oxygen plasma. In various embodiments, the oxidizing conditions may depend on the oxidation target. The oxidation may be performed in an oxygen environment at a temperature in the range of about 800° C. to about 1100° C. for a time period in the range of about 10 seconds to about 1 hour, or about 1 minute to about 30 minutes. In various embodiments, the silicon of the SiGe of the exposed fin 140 may be selectively oxidized to increase the ratio of germanium to silicon in the remaining SiGe.

The oxidation of exposed SiGe may produce germanium enrichment in the exposed vertical fin 140. A modified vertical fin 180, having a higher Ge concentration in at least a portion of the vertical fin, may be formed from the unmodified vertical fin 140. The oxidation of the Si may also reduce the width of at least a portion of the vertical fin 140 as the silicon is converted to silicon oxide (e.g., $SiO_2$) to form a narrower modified vertical fin 180, and silicon oxide layer(s) 170. In various embodiments, vertical fin(s) 140 to be modified may be formed initially with a greater width than vertical fin(s) 140 that remains unmodified. In this manner, vertical FET channels having the same width may be obtained by starting with wider vertical fin 140 for the SiGe fins intended to have greater Ge concentration to accommodate the consumption of the Si in the SiGe through the condensation oxidation.

In various embodiments, the modified vertical fin 180 may have a first portion 145, which may be below the level of the bottom spacer 130, and a second portion 181 above the level of the bottom spacer 130, where the second portion 181 has a narrower width and a higher Ge concentration. The first portion 145 of the modified vertical fin 180 may be on the substrate and the second portion of the modified vertical fin 180 may be on the first portion 145, which remains essentially unmodified. The first portion 145 of the vertical fin 180 may have the same crystal orientation as the substrate 110 and a first portion width, and a second portion 181 of the vertical fin 180 may have the same crystal orientation as the first portion 145 of the vertical fin, and the second portion 181 of the vertical fin may have a second portion width less than the first portion width.

In an exemplary embodiment, two vertical fins 140 of SiGe, referred to as a first vertical fin and a second vertical fin, may be epitaxially grown on a single crystal silicon substrate 110. The first vertical fin 140 may be covered with a protective cap 160, and the exposed sidewalls of the second vertical fin 140 may be oxidized to a depth less than the width of the second vertical fin 140, where oxidation of the SiGe selectively consumes silicon to form a silicon oxide layer 170, and redistributes the germanium at the oxidation interface. Since a portion of the second vertical fin remains covered by the bottom spacer 130 during oxidation, a first portion 145 of the second vertical fin 140 may remain unmodified. The second portion 181 of the modified vertical fin 180 may have a greater percentage of germanium than the first portion 145 of the vertical fin. The first portion 145 of the vertical fin 180 may have the same crystal orientation as the substrate 110, and the second portion 181 of the vertical fin 180 may have the same crystal orientation as the first portion 145 of the vertical fin.

In various embodiments, an unmodified vertical fin 140 may have a germanium concentration in the range of about 10 at. % Ge to about 40 at. % Ge, or in the range of 20 at. % Ge to about 30 at. % Ge. In various embodiments, at least a second portion 181 of a modified vertical fin 180 may have a germanium concentration in the range of about 20 at. % Ge to about 50 at. % Ge, or in the range of 30 at. % Ge to about 50 at. % Ge, or in the range of about 20 at. % Ge to about 40 at. % Ge, although a greater or lesser germanium concentration is also considered within the scope of the disclosure.

In various embodiments, the modified vertical fin 180 has a lower threshold voltage, $V_t$, than the unmodified vertical fin 140 due to the increased Ge concentration in at least the second portion 181. While not being bound by theory, the threshold voltage may be reduced by increasing the Ge concentration due to a narrowing of the band gap of the SiGe and/or a strain change in the SiGe material.

In various embodiments, at least a second portion 181 of the modified vertical fin 180 may have a width in the range of about 5 nm to about 20 nm, or in the range of about 7 nm to about 18 nm, or in the range of about 7 nm to about 12 nm. The unmodified vertical fin portion 145 may retain the initial width and concentration ratio of Si to Ge, which may be essentially the same as vertical fin 140.

Figure 6:
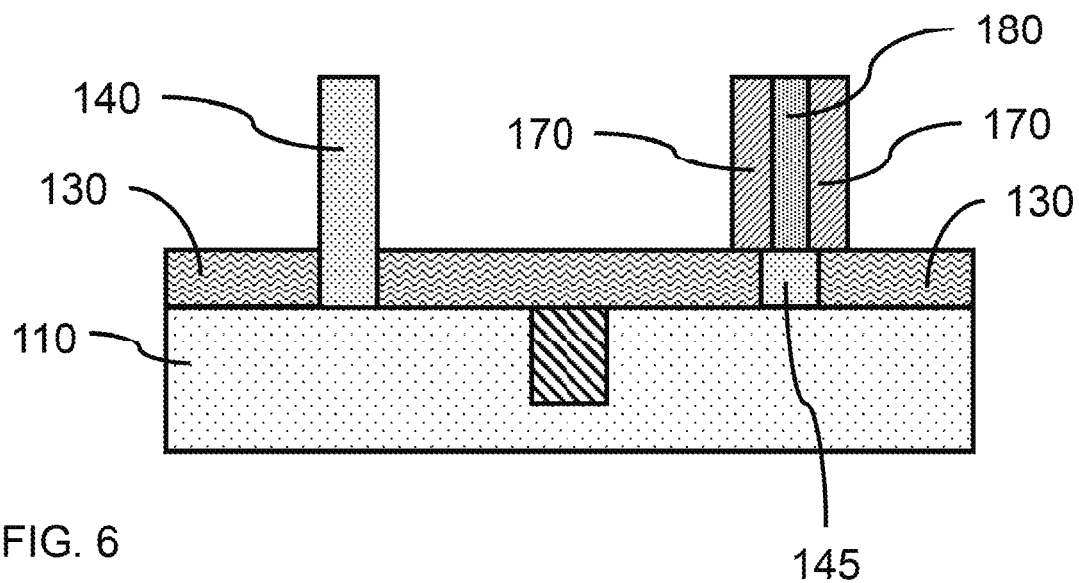
FIG. 6 is a cross-sectional view of a decapped vertical fin and an oxidized vertical fin in accordance with an exemplary embodiment.

FIG. 6 is a cross-sectional view of a decapped vertical fin and an oxidized vertical fin in accordance with an exemplary embodiment.

In one or more embodiments, the protective cap 160 and cap 150 may be removed to expose the unmodified vertical fin 140 and top surface of the modified vertical fin 180. The protective cap 160 and cap 150 may be selectively removed by suitable etching. The silicon oxide layers 170 may remain on the sidewalls of the second portion 181 of the modified vertical fin 180, and cover at least the first portion 145 of the vertical fin that remained unmodified. The silicon oxide layers may be formed at least on opposite sides of the vertical fin, and may surround the vertical fin.

Figure 7:
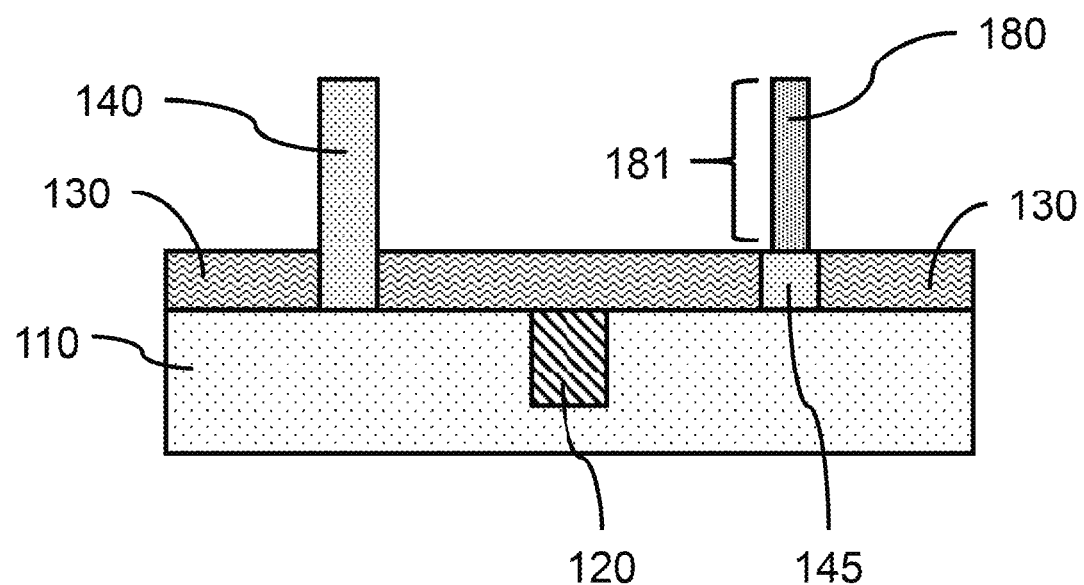
FIG. 7 is a cross-sectional view of an unmodified vertical fin and a modified vertical fin in accordance with an exemplary embodiment.

FIG. 7 is a cross-sectional view of an unmodified vertical fin and a modified vertical fin in accordance with an exemplary embodiment.

In one or more embodiments, the silicon oxide layer(s) 170 may be removed from the sidewalls of the modified vertical fin 180 to expose the sidewalls of the modified vertical fin 180. The silicon oxide layer(s) 170 may be selectively removed by suitable etching.

Figure 8:
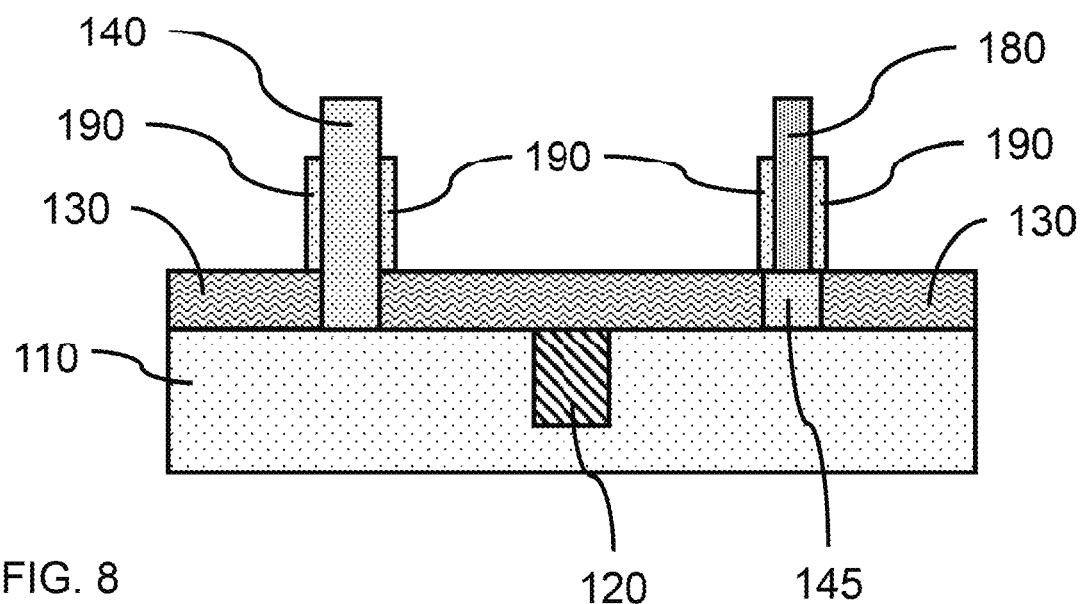
FIG. 8 is a cross-sectional view of a gated unmodified vertical fin and a gated modified vertical fin in accordance with an exemplary embodiment.

FIG. 8 is a cross-sectional view of a gated unmodified vertical fin and a gated modified vertical fin in accordance with an exemplary embodiment.

In one or more embodiments, a gate structure 190 may be formed on the sidewalls of unmodified vertical fin 140 and/or modified vertical fin 180, where the gate structure 190 may include a conductive gate and an insulating layer between a vertical fin and the conductive gate. Formation of the gate structure 190 may be accomplished by suitable masking, patterning, and/or depositions.

In one or more embodiments, the conductive gate and an insulating layer form the gate structure 190 with the vertical fin 140, 180 for control of current through the vertical fin 140, 180, where the gate structure 190 may be on the sidewalls and surround the vertical fin 140, 180. In various embodiments, the gate structure may have a height in the range of about 10 nm to about 300 nm, or about 15 nm to about 200 nm, or about 20 nm to about 100 nm.

In one or more embodiments, each gate structure includes a gate dielectric layer and a gate conductor layer. The gate dielectric layer may have a thickness in the range of about 1 nm to about 5 nm. In various embodiments, the insulating layer formed on the modified vertical fin 180 may have the same thickness as the insulating layer formed on the unmodified vertical fin 140. The gate dielectric material may be a silicon oxide (e.g., SiO2), a silicon nitride (e.g., $Si_3N_4$), silicon oxynitride (SiON), boron nitride (e.g., BN) a high-K material, or a combination thereof. Examples of high-k materials include but are not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k may further include dopants such as lanthanum and/or aluminum. The stoichiometry of the high-K compounds may vary.

In one or more embodiments, the gate conductor may have a thickness in the range of about 5 nm to about 50 nm. The gate conductor material may be polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The stoichiometry of the conductive material compounds may vary.

Figure 9:
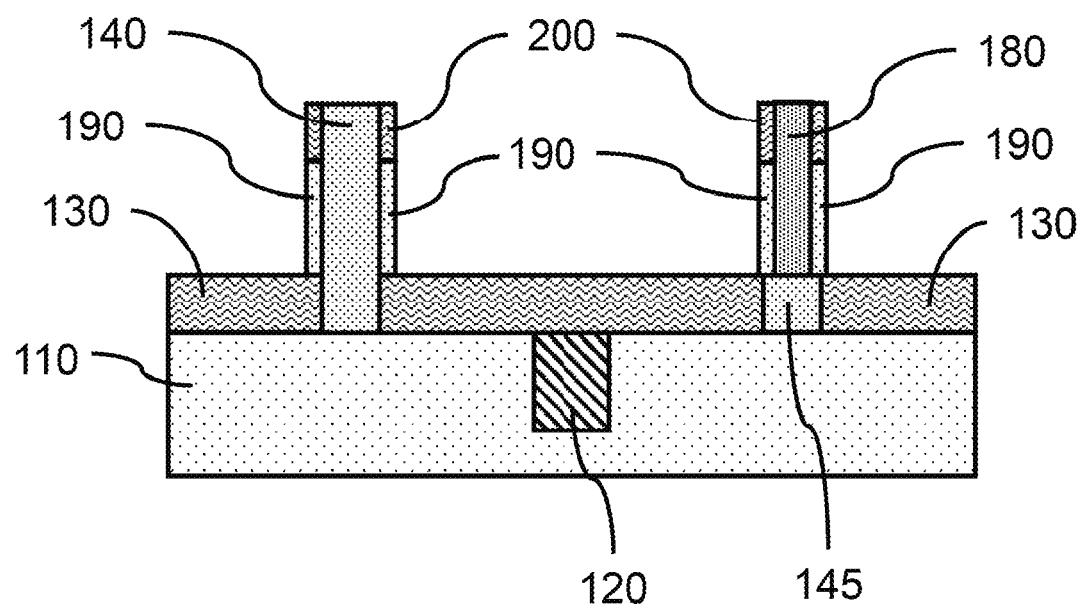
FIG. 9 is a cross-sectional view of a gated unmodified vertical fin and a gated modified vertical fin in accordance with an exemplary embodiment.

FIG. 9 is a cross-sectional view of a gated unmodified vertical fin and a gated modified vertical fin in accordance with an exemplary embodiment.

In one or more embodiments, a top spacer 200 may be formed on the sidewall(s) of the unmodified vertical fin 140 and/or modified vertical fin 180, where the top spacer may electrically isolate at least the conductive gate of the gate structure 190 from a subsequently formed source/drain region of a finFET. The spacer may be an oxide, for example silicon oxide (SiO), a nitride, for example, silicon nitride (SiN), and/or an oxy-nitride, for example, silicon oxynitride (SiON). The top spacer 200 may be between the gate structure 190 and a source/drain region on the second portion 181 of the vertical fin 180.

Figure 10:
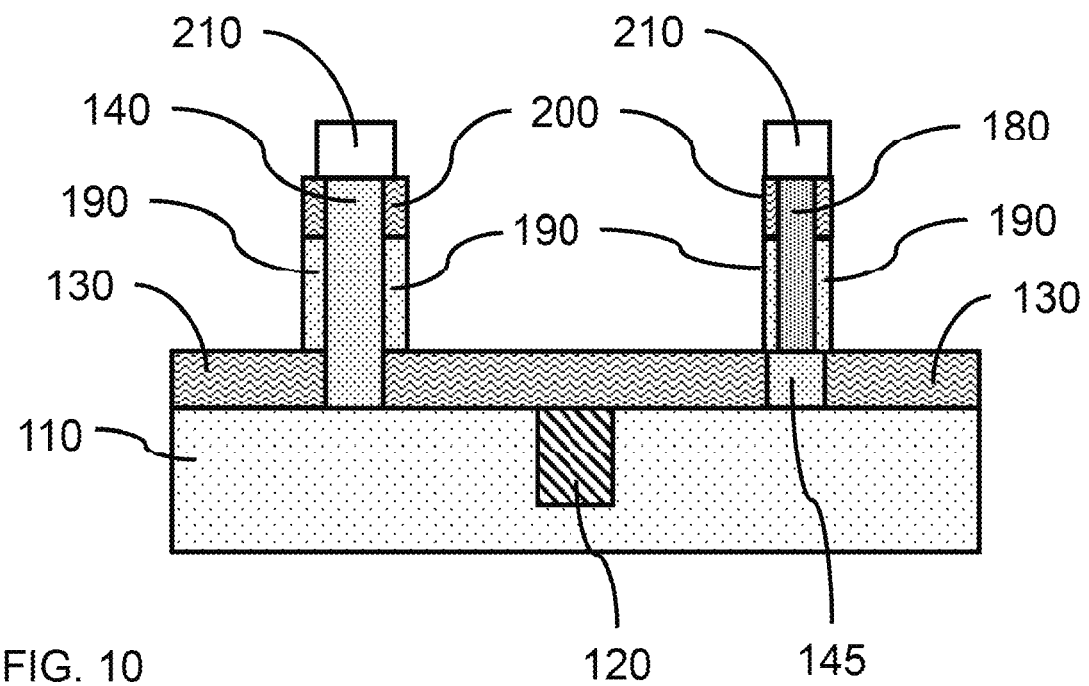
FIG. 10 is a cross-sectional view of a modified and unmodified vertical fin with source regions in accordance with an exemplary embodiment.

FIG. 10 is a cross-sectional view of a modified and unmodified vertical fin with source/drain regions in accordance with an exemplary embodiment.

In one or more embodiments, a source/drain region 210 may be formed on the top surface of the unmodified vertical fin 140 and/or modified vertical fin 180, where the source/drain region 210 may be formed by epitaxial growth on the unmodified vertical fin 140 and/or modified vertical fin 180. The source/drain region 210 may have the same crystal orientation as the vertical fin on which it is formed. It should be noted that the source and drain can be interchangeable between the top and bottom locations of a vertical fin. The formation may be epitaxial growth of a semiconductor material, such as silicon or silicon-germanium on a germanium-enriched SiGe vertical fin 180. In various embodiments, the epitaxial material may be in-situ doped (i.e., during epitaxy) or ex-situ doped (i.e., after epitaxy). Doping may be p-type doping or n-type doping.

Figure 11:
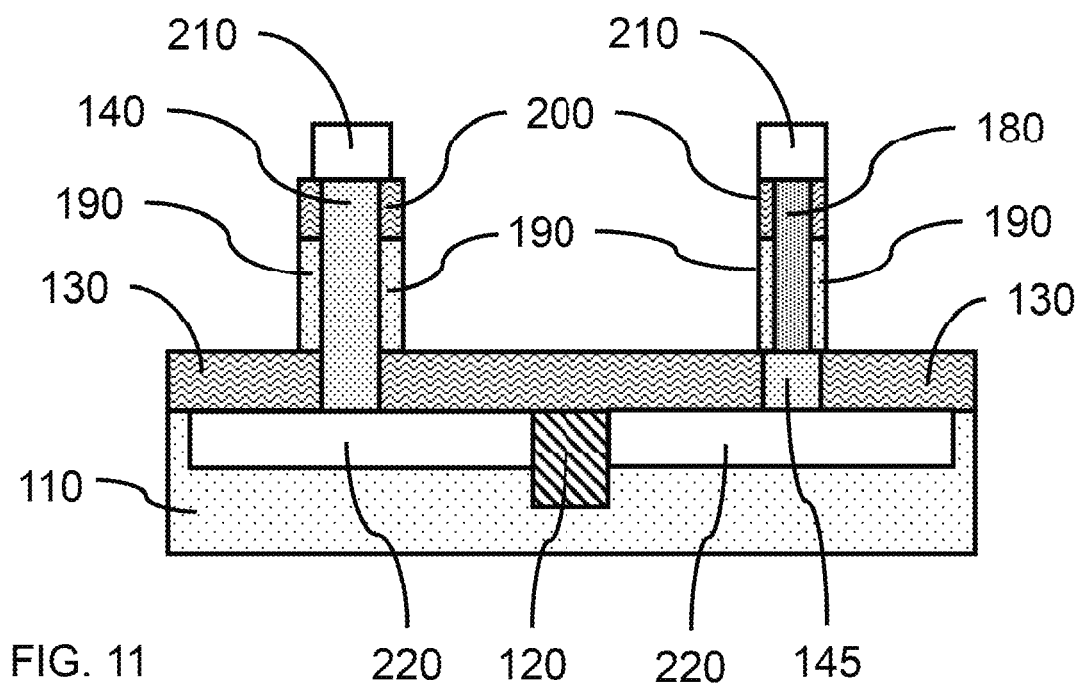
FIG. 11 is a cross-sectional view of a pair of vertical finFETs in accordance with an exemplary embodiment.

FIG. 11 is a cross-sectional view of a pair of vertical finFETs in accordance with an exemplary embodiment.

In one or more embodiments, a doped region (e.g., source/drain) 220 may be formed in the substrate 110 below unmodified vertical fin 140 and/or modified vertical fin 180. The doped region 220 may be formed by any suitable doping technique, for example, ion implantation, in-situ doped epitaxy, etc. The doped region 220 may be n-doped or p-doped. The shallow trench isolation (STI) may be between the location of a first vertical fin and the location of a second vertical fin. In various embodiments, two adjacent doped regions 220 may be formed in the substrate 110, and referred to as a first doped region (e.g., source/drain) and a second doped region (e.g., source/drain). The shallow trench isolation may be situated between the doped regions 220 of the unmodified vertical fin 140 and/or modified vertical fin 180 to provide electrical isolation.

Figure 12:
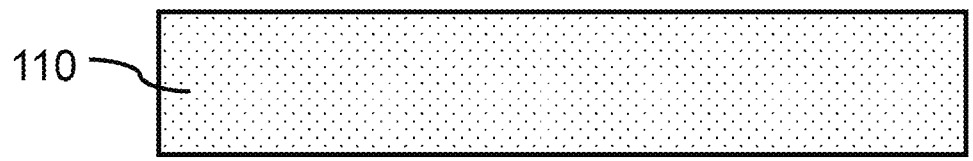
FIG. 12 is a cross-sectional view of a substrate in accordance with an exemplary embodiment.

FIG. 12 is a cross-sectional view of a substrate in accordance with an exemplary embodiment.

In one or more embodiments, a substrate 110 may be a semiconductor substrate, where the substrate may be a single crystal semiconductor wafer or a crystalline semiconductor layer on a supporting wafer. In various embodiments, the substrate may be silicon or silicon-germanium. The substrate may be a semiconductor-on-insulator (SeOI), silicon-on-insulator (SOI), or silicon-germanium-on-insulator (SeGeOI). The substrate 110 may have a <100> or a <111> crystal face exposed for subsequent depositions, where the crystal lattice may facilitate epitaxial growth.

Figure 13:
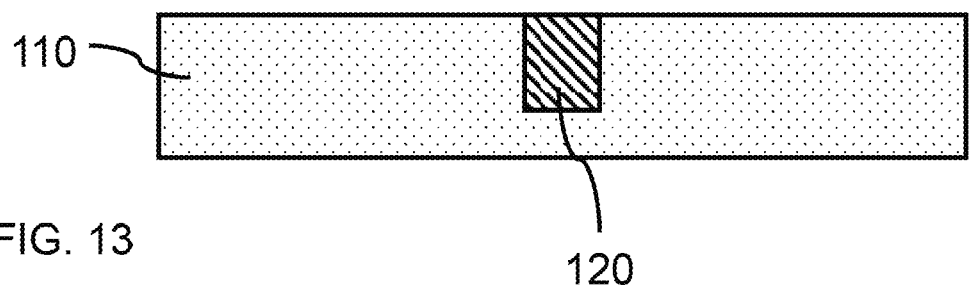
FIG. 13 is a cross-sectional view of a substrate and isolation region in accordance with an exemplary embodiment.

FIG. 13 is a cross-sectional view of a substrate and isolation region in accordance with an exemplary embodiment.

In one or more embodiments, a substrate may be masked and patterned to form one or more trench(es) in which an insulator material may be formed. The trench and insulator material may provide an isolation region 120 for subsequent layers and structures formed on the substrate, where the isolation region 120 may include an oxide, for example, silicon oxide ($SiO_x$) to provide electrical isolation.

Figure 14:
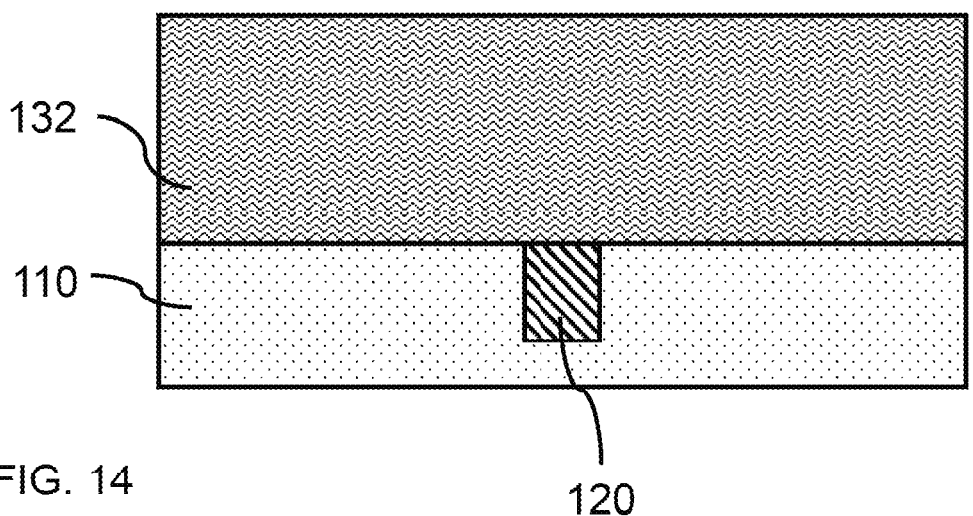
FIG. 14 is a cross-sectional view of a substrate, isolation region, and hardmask layer in accordance with an exemplary embodiment.

FIG. 14 is a cross-sectional view of a substrate, isolation region, and hardmask layer in accordance with an exemplary embodiment.

In one or more embodiments, a hardmask layer 132 may be formed on the substrate 110 and isolation region 120. In various embodiments, the hardmask layer 132 may be a nitride, for example, silicon nitride.

Figure 15:
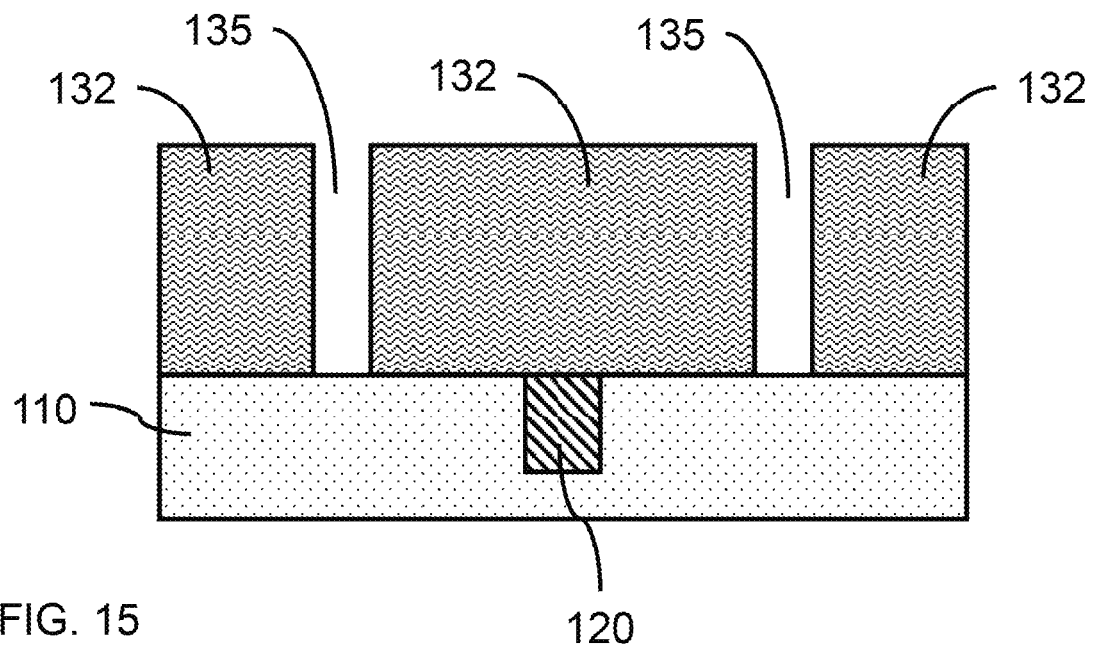
FIG. 15 is a cross-sectional view of a substrate, isolation region, and patterned hardmask layer in accordance with an exemplary embodiment.

FIG. 15 is a cross-sectional view of a substrate, isolation region, and patterned hardmask layer in accordance with an exemplary embodiment.

In one or more embodiments, the hardmask layer 132 may be masked and patterned, and trenches 135 formed in the hardmask layer 132, where the trenches 135 may be formed by reactive ion etching (RIE). The trenches 135 may extend to the surface of the substrate, such that the crystal lattice of the substrate surface is exposed at the bottom of the trench 135.

In various embodiments, the trenches 135 may have a width in the range of about 8 nm to about 25 nm, or in the range of about 10 nm to about 20 nm, or in the range of about 10 nm to about 15 nm.

Figure 16:
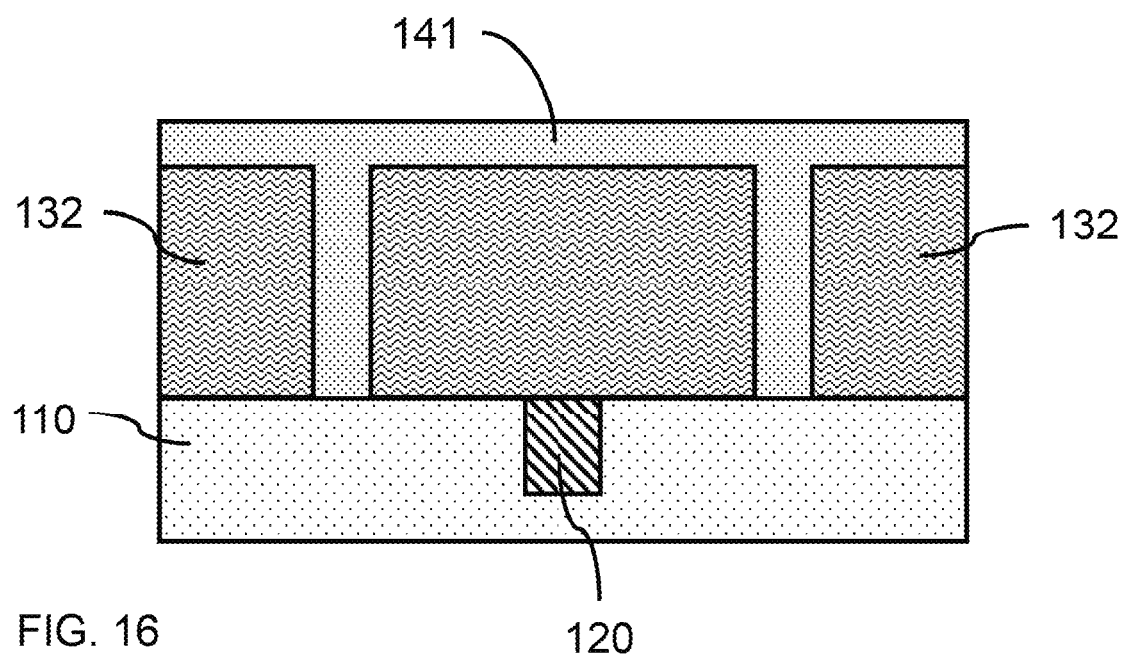
FIG. 16 is a cross-sectional view of a substrate and compound semiconductor formed in a patterned hardmask layer in accordance with an exemplary embodiment.

FIG. 16 is a cross-sectional view of a substrate and compound semiconductor formed in a patterned hardmask layer in accordance with an exemplary embodiment.

In one or more embodiments, a fin material 141 may be formed in the trenches, where the fin material 141 may extend above the surface of the hardmask layer 132. The in material 141 may be formed in the trenches 135 by epitaxial deposition, where the deposition may be heteroepitaxial growth of a SiGe vertical fin 140 on a crystalline silicon substrate surface. The fin material 141 may be a doped semiconductor or compound semiconductor, for example, SiGe.

Figure 17:
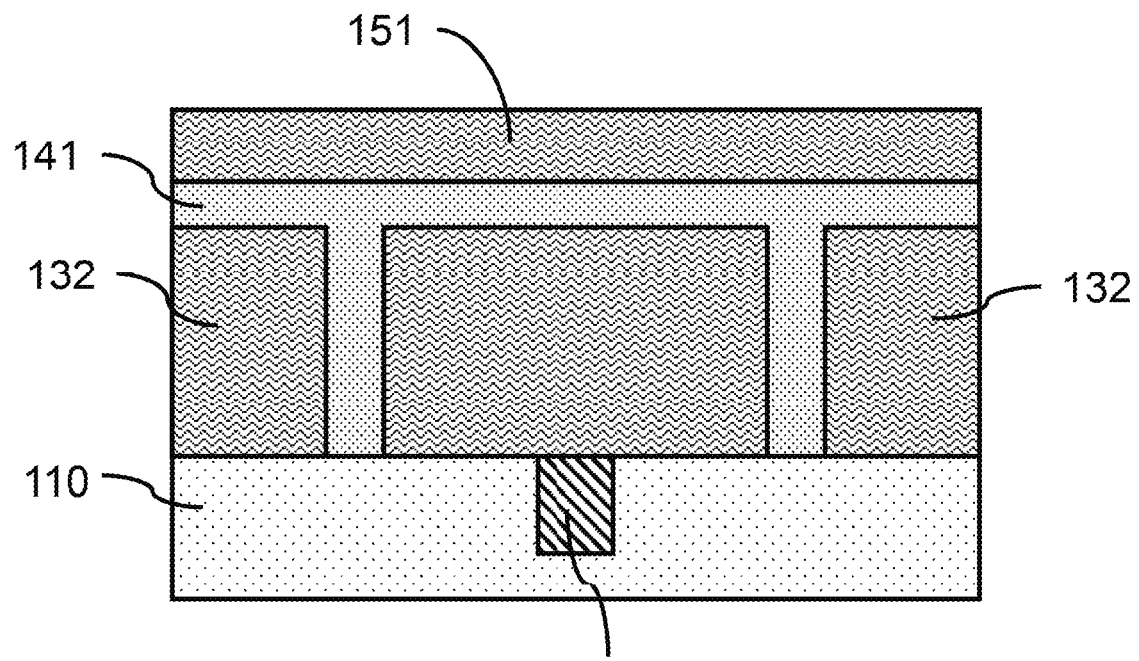
FIG. 17 is a cross-sectional view of a substrate and compound semiconductor formed in a patterned hardmask layer with a protective layer in accordance with an exemplary embodiment.

FIG. 17 is a cross-sectional view of a substrate and compound semiconductor formed in a patterned hardmask layer with a protective layer in accordance with an exemplary embodiment.

In one or more embodiments, a cap layer 151 may be formed on the exposed surface of the fin material 141. The cap layer 151 may be a nitride, for example, silicon nitride (SiN).

Figure 18:
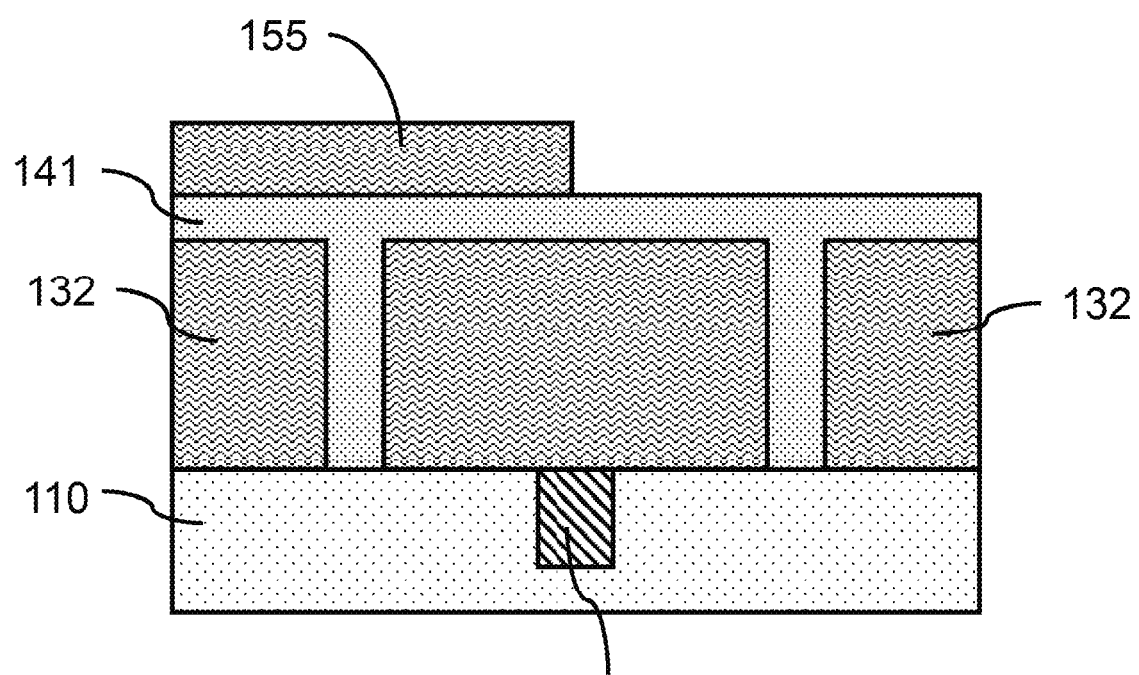
FIG. 18 is a cross-sectional view of a substrate and compound semiconductor formed in a patterned hardmask layer with a patterned protective layer in accordance with an exemplary embodiment.

FIG. 18 is a cross-sectional view of a substrate and compound semiconductor formed in a patterned hardmask layer with a patterned protective layer in accordance with an exemplary embodiment.

In one or more embodiments, the cap layer 151 may be masked, patterned, and etched to remove at least a portion of cap layer 151 from one or more regions above a trench 135 having a fill of fin material 141, while leaving a capped portion 155 over one or more regions above a trench 135 having a fill of fin material 141.

Figure 19:
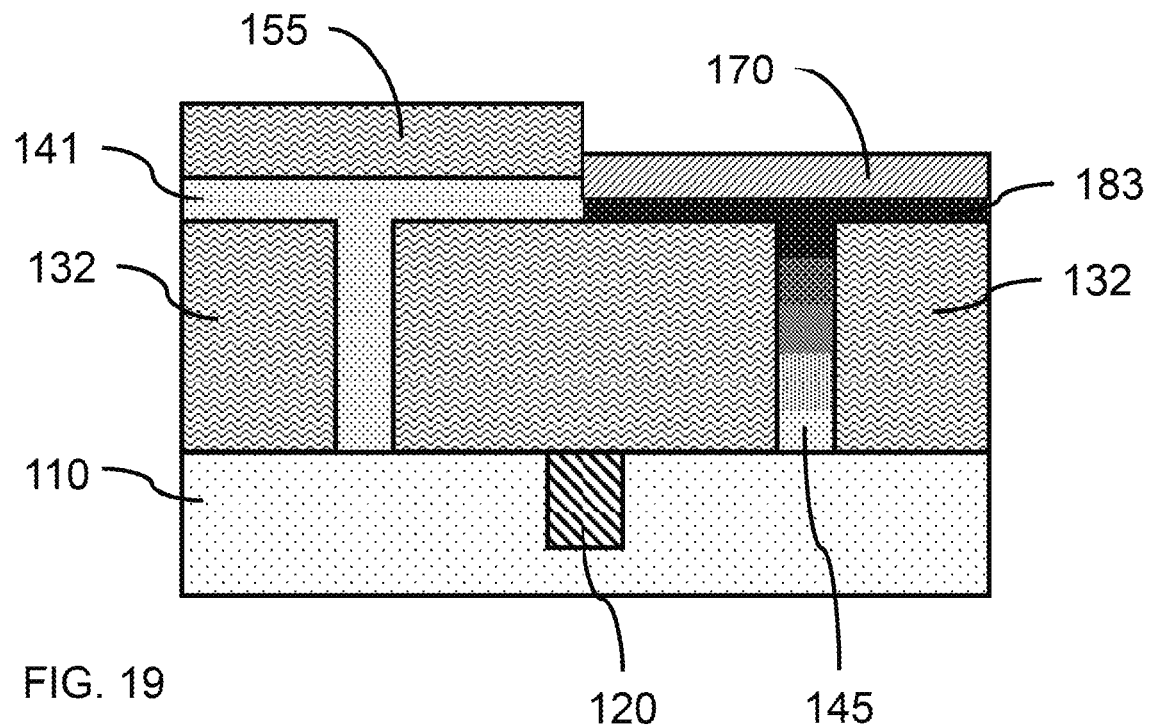
FIG. 19 is a cross-sectional view of a substrate with an oxidized portion of a compound semiconductor and a protected portion of a compound semiconductor in accordance with an exemplary embodiment.

FIG. 19 is a cross-sectional view of a substrate with an oxidized portion of a compound semiconductor and a protected portion of a compound semiconductor in accordance with an exemplary embodiment.

In one or more embodiments, the exposed fin material 141 may be oxidized, for example, by a dry thermal oxidation, to produce germanium condensation in at least a portion of the fill of fin material 141 in a trench 135. A silicon oxide layer 170 may be formed over a graded fin material 183, where oxidation of SiGe selectively consumes silicon to form a silicon oxide layer 170, and redistributes the germanium at the oxidation interface. The upper portion 185 of the modified vertical fin 180 may have an increased germanium concentration, and a second portion 181 of the modified vertical fin 180 may have a vertically graded germanium concentration, while a first portion 145 may retain the initial concentration ratio of Si to Ge, which may be essentially the same as fin material 141.

Figure 20:
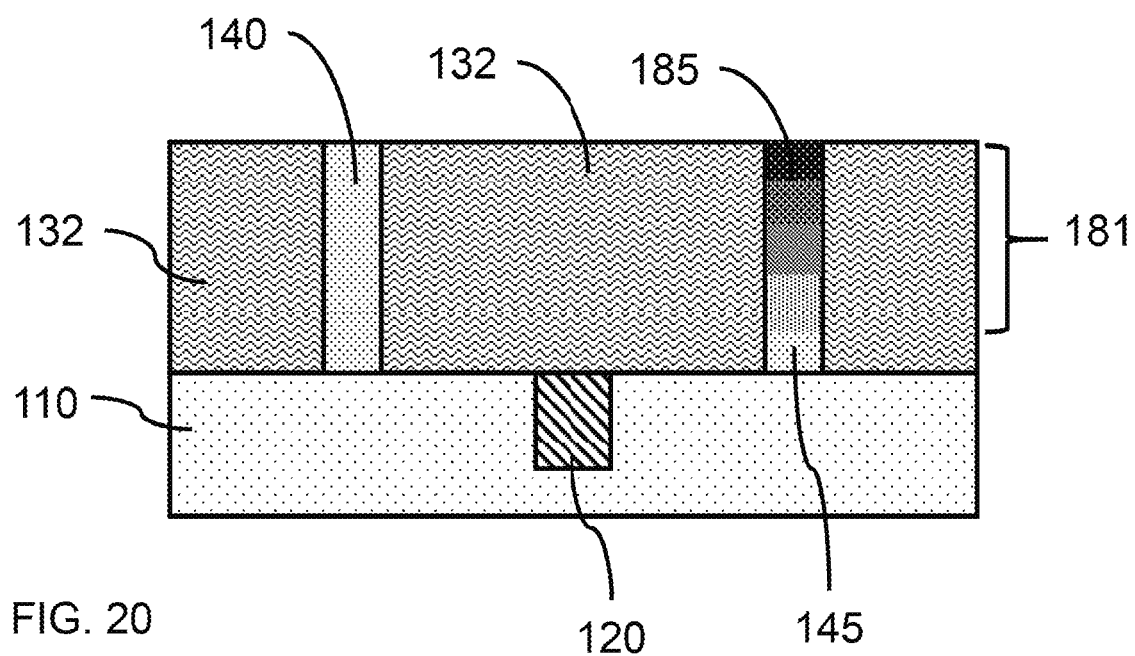
FIG. 20 is a cross-sectional view of a substrate with a graded compound semiconductor and an unmodified compound semiconductor in accordance with an exemplary embodiment.

FIG. 20 is a cross-sectional view of a substrate with a graded compound semiconductor and an unmodified compound semiconductor in accordance with an exemplary embodiment.

In one or more embodiments, the capped portion 155, exposed fin material 141, and top portion of the graded fin material 183 may be removed, where the material layers may be removed by any suitable removal process, for example, chemical-mechanical polishing and/or selective etching.

Figure 21:
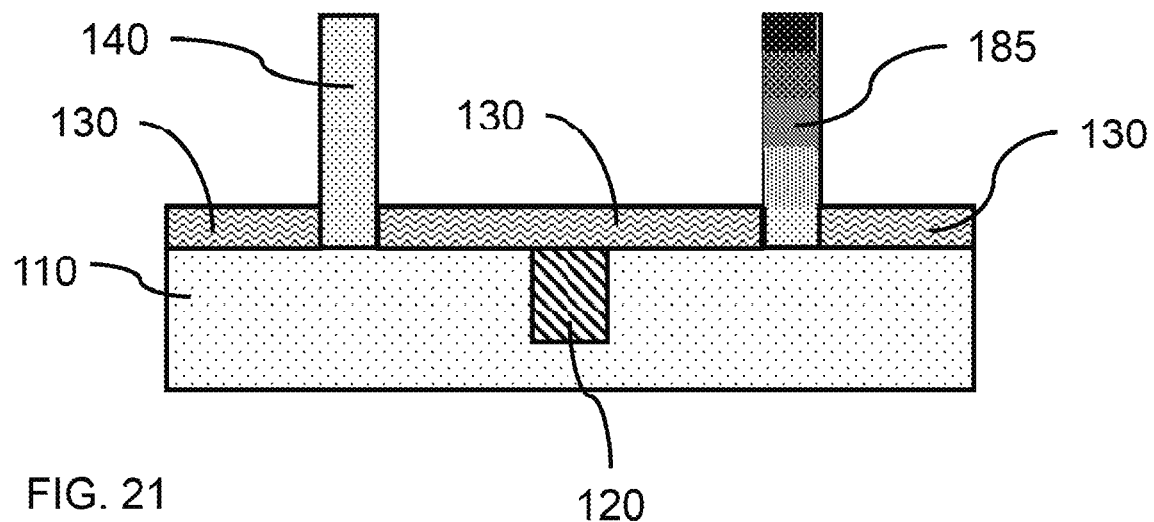
FIG. 21 is a cross-sectional view of a substrate with an unmodified fin and a modified fin with a vertically graded composition in accordance with an exemplary embodiment.

FIG. 21 is a cross-sectional view of a substrate with an unmodified fin and a modified fin with a vertically graded composition in accordance with an exemplary embodiment.

In one or more embodiments, the hardmask layer 132 may be removed, and a bottom spacer 130 may be formed between the substrate and a portion of the modified vertical fin and the unmodified vertical fin. The bottom spacer material 130 may be formed by a suitable deposition process, which may be followed by a suitable etch. The hardmask layer 132 may be recessed to leave a portion of the hardmask along the bottom of the trench. In various embodiments, a remaining portion of hardmask layer 132 may become the bottom spacer 130.

Figure 22:
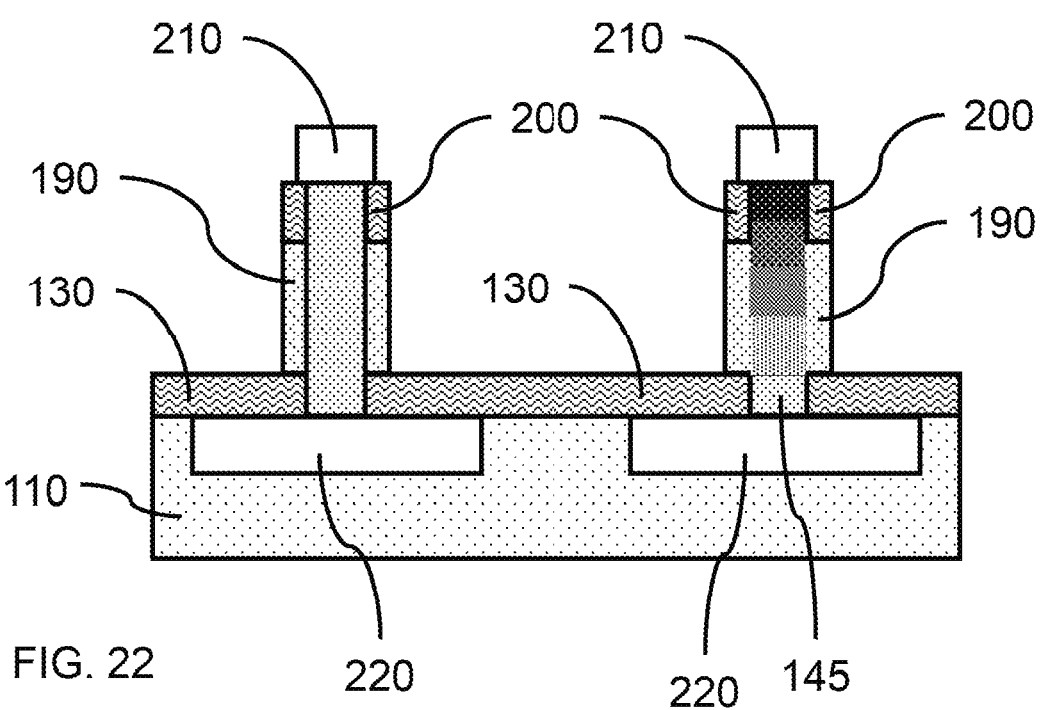
FIG. 22 is a cross-sectional view of a substrate with a gated unmodified fin and a gated fin with a vertically graded composition in accordance with an exemplary embodiment.
Figure 23:
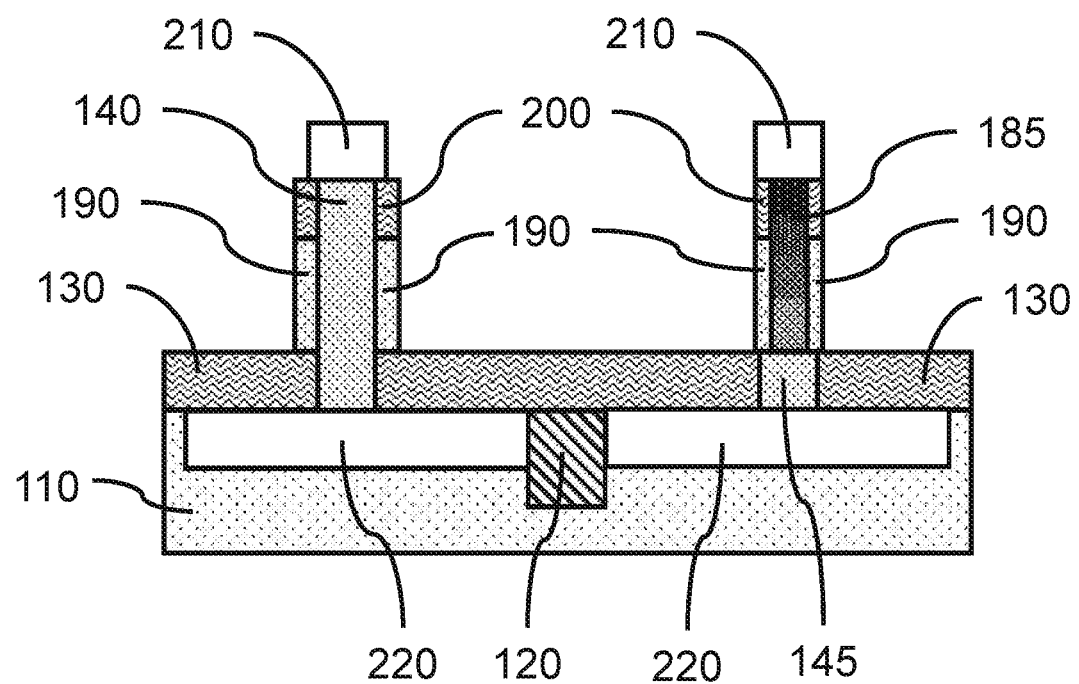
FIG. 23 is a cross-sectional view of a vertical fin field effect transistor.

FIG. 22 is a cross-sectional view of a substrate with a gated unmodified fin and a gated fin with a vertically graded composition in accordance with an exemplary embodiment.

In one or more embodiments, a gate structure 190 may be formed on the unmodified fin, and a gate structure may be formed on the modified fin.

In a non-limiting exemplary embodiment, a vertical fin field effect transistor includes a doped region 220 in a substrate 110, wherein the doped region 220 has the same crystal orientation as the substrate 110, a first portion 145 of a vertical fin on the doped region, wherein the first portion 145 of the vertical fin has the same crystal orientation as the substrate 110 and a first portion width, a second portion 181 of the vertical fin on the first portion 145 of the vertical fin, wherein the second portion 181 of the vertical fin has the same crystal orientation as the first portion 145 of the vertical fin, and the second portion 181 of the vertical fin has a second portion width less than the first portion width, wherein the first portion 145 of the vertical fin and the second portion 181 of the vertical fin are silicon germanium, the second portion 181 of the vertical fin has a greater percentage of germanium than the first portion 145 of the vertical fin, and the second portion 181 of the vertical fin has a vertically graded germanium concentration, a gate structure 190 on the second portion 181 of the vertical fin, and a source/drain region 210 on the top of the second portion 181 of the vertical fin.

While the embodiments have been depicted and described with particular arrangements and orientations, this is for descriptive purposes only. In various embodiments, for example, the locations of the source and drain of a vertical transistor may be reversed such that the drain is on the top of a vertical fin, while the source is at the bottom. The source may, therefore, be at the bottom or the top. Similarly, while the figures have been depicted and described with a modified vertical fin adjacent to a non-modified vertical fin, various patterns and arrangements having different sequences of modified and unmodified fins are also contemplated.

Having described preferred embodiments of the fabrication of vertical fin transistors with multiple threshold voltages (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a pair of vertical fin field effect transistors, comprising:
    epitaxially growing a first vertical fin of silicon-germanium on a substrate;
    epitaxially growing a second vertical fin of silicon-germanium on the substrate;
    forming a cap on the top surface of the first vertical fin;
    forming a protective cap over the top surface and sidewalls of the second vertical fin before oxidizing the sidewalls of the first vertical fin, so only the sidewalls of the first vertical fin form silicon oxide layers;
    oxidizing the sidewalls of the first vertical fin to form silicon oxide layers at least on opposite sides of the first vertical fin, and increasing the germanium concentration of the first vertical fin; and
    removing the silicon oxide layers to form a portion of the first vertical fin having a reduced width.

2. The method of claim 1, wherein the substrate is crystalline silicon.

3. The method of claim 1, further comprising,
    removing the protective cap from the second vertical fin and the cap from the top surface of the first vertical fin.

4. The method of claim 3, further comprising, forming a bottom spacer on the substrate;
    forming a first gate structure on the first vertical fin; and
    forming a second gate structure on the second vertical fin.

5. The method of claim 4, further comprising forming shallow trench isolation in the substrate, wherein the shallow trench isolation is between the location of the first vertical fin and the location of the second vertical fin.

6. The method of claim 1, wherein the concentration of germanium in at least a portion of the first vertical fin is greater than the concentration of germanium in the second vertical fin.

7. The method of claim 6, wherein at least a portion of the first vertical fin has a vertically graded germanium concentration.

8. The method of claim 6, wherein the first vertical fin with the reduced width has a germanium concentration in the range of about 20 at. % Ge to about 50 at. % Ge.

9. The method of claim 8, wherein the first vertical fin with the reduced width has a greater germanium concentration than the second vertical fin.

10. The method of claim 9, wherein the first vertical fin with the reduced width has a reduced threshold voltage compared to the second vertical fin.

11. A method of fabricating a pair of vertical fin field effect transistors, comprising:
    epitaxially growing a first vertical fin of silicon-germanium on a single-crystal silicon substrate;
    epitaxially growing a second vertical fin of silicon-germanium on the single-crystal silicon substrate;
    forming a cap on the top surface of the first vertical fin;
    forming a protective cap over the top surface and sidewalls of the second vertical fin before oxidizing the sidewalls of the first vertical fin, so only the sidewalls of the first vertical fin form silicon oxide layers;
    oxidizing the sidewalls of the first vertical fin to form silicon oxide layers at least on opposite sides of the first vertical fin, and increasing the germanium concentration of the first vertical fin;
    removing the silicon oxide layers to form a portion of the first vertical fin having a reduced width; and
    removing the protective cap from the second vertical fin and the cap from the top surface of the first vertical fin.

12. The method of claim 11, further comprising, forming a first gate structure on the first vertical fin, and forming a second gate structure on the second vertical fin.

13. The method of claim 12, wherein the first gate structure on the first vertical fin and the second gate structure on the second vertical fin each includes a gate dielectric layer and a gate conductor layer.

14. The method of claim 13, further comprising, forming a first source/drain region on the first vertical fin, and forming a second source/drain region on the second vertical fin.

15. The method of claim 14, further comprising, forming a shallow trench isolation region between the first vertical fin and second vertical fin.

16. A method of fabricating a pair of vertical fin field effect transistors, comprising:
    forming a shallow trench isolation region in a single-crystal silicon substrate;
    forming a hardmask layer on the single-crystal silicon substrate and the shallow trench isolation region, wherein the shallow trench isolation region is below the hardmask layer;
    forming a first trench in the hardmask layer on one side of the shallow trench isolation region, and a second trench in the hardmask layer on the opposite side of the shallow trench isolation region from the first trench;
    forming a silicon-germanium fin material in the first trench and the second trench, wherein the silicon-germanium fin material extends above a top surface of the hardmask layer;
    forming a capped portion over the first trench;
    oxidizing the silicon-germanium fin material to form a silicon oxide layer, a graded fin material over the second trench, and a modified vertical fin having an upper portion with an increased germanium concentration in the second trench;
    removing the capped portion and silicon oxide layer; and
    removing the silicon-germanium fin material and graded fin material.

17. The method of claim 16, further comprising, removing the hardmask layer to expose an unmodified vertical fin and the modified vertical fin.

18. The method of claim 17, further comprising, forming a first gate structure on the modified vertical fin, and a second gate structure on the unmodified vertical fin.

19. The method of claim 18, wherein the modified vertical fin has a second portion with a vertically graded germanium concentration.

20. The method of claim 19, further comprising, forming a first source/drain region on the top of the unmodified vertical fin, and a second source/drain region on the top of the modified vertical fin.

* * * * *